(12) United States Patent
Schanz

(10) Patent No.: US 11,619,557 B2
(45) Date of Patent: Apr. 4, 2023

(54) TORQUE TRANSMITTER AND TORQUE SENSOR, MANUFACTURING METHOD THEREOF, AND METHOD OF MEASURING TORQUE USING THE SAME

(71) Applicant: Trafag AG, Bubikon (CH)

(72) Inventor: Christoph Schanz, Frickenhausen (DE)

(73) Assignee: Trafag AG, Bubikon (CH)

( * ) Notice: Subject to any disclaimer, the term of this patent is extended or adjusted under 35 U.S.C. 154(b) by 0 days.

(21) Appl. No.: 17/883,684

(22) Filed: Aug. 9, 2022

(65) Prior Publication Data

US 2022/0390302 A1    Dec. 8, 2022

Related U.S. Application Data

(63) Continuation of application No. 16/500,599, filed as application No. PCT/EP2018/058253 on Mar. 29, 2018, now Pat. No. 11,422,048.

(30) Foreign Application Priority Data

Apr. 3, 2017  (DE) .................... 10 2017 107 111.3
Apr. 10, 2017 (DE) .................... 10 2017 107 716.2

(51) Int. Cl.
| | | |
|---|---|---|
| *G01L 3/10* | (2006.01) | |
| *G01R 33/02* | (2006.01) | |
| *B25J 13/08* | (2006.01) | |
| *G01D 5/20* | (2006.01) | |
| *G01L 5/00* | (2006.01) | |
| *G01P 3/44* | (2006.01) | |

(52) U.S. Cl.
CPC .............. *G01L 3/102* (2013.01); *B25J 13/085* (2013.01); *G01D 5/20* (2013.01); *G01L 5/0019* (2013.01); *G01P 3/44* (2013.01); *G01R 33/02* (2013.01)

(58) Field of Classification Search
CPC ....... G01L 3/102; G01L 5/0019; G01R 33/02; B25J 13/085; G01D 5/20; G01P 3/44
USPC ........................ 73/862, 862.333, 760, 862.05
See application file for complete search history.

(56) References Cited

U.S. PATENT DOCUMENTS 11,422,048 B2 *   8/2022  Schanz ................. G01L 5/0019

* cited by examiner

*Primary Examiner* — Arnold M Kinkead
(74) *Attorney, Agent, or Firm* — United One Law Group LLC; Kongsik Kim; Jhongwoo Peck

(57) ABSTRACT

A torque transmitter for a torque sensor for measuring a torque on a shaft includes a carrier plate that includes a plurality of sensor element carrier plate regions, on each of which at least one sensor element for recording magnetic field changes is arranged, and an enclosure region formed in a substantially annular shape to enclose the shaft around a circumference of the shaft. The plurality of sensor element carrier plate regions are perpendicularly connected to the enclosure region and arranged radially within the enclosure region by being spaced apart along a circumferential direction around the circumference of the shaft.

14 Claims, 7 Drawing Sheets

TORQUE TRANSMITTER AND TORQUE SENSOR, MANUFACTURING METHOD THEREOF, AND METHOD OF MEASURING TORQUE USING THE SAME

CROSS-REFERENCE TO RELATED APPLICATIONS

The present application is a Continuation of U.S. application Ser. No. 16/500,599 filed on Oct. 3, 2019, now issued as U.S. Pat. No. 11,422,048, which is a National Stage Entry of PCT/EP2018/058253 filed on Mar. 29, 2018, which claims priority from German Application No. 10 2017 107 716.2 filed on Apr. 10, 2017 and German Application No. 10 2017 107 111.3 filed on Apr. 3, 2017. The aforementioned applications are incorporated herein by reference in their entireties.

BACKGROUND

The invention relates to a torque transmitter for a torque sensor for measuring a torque on a shaft by recording magnetic field changes. The invention also relates to a torque sensor provided with such a torque transmitter, to a torque measurement arrangement provided with such a torque transmitter, to a method for manufacturing such a torque transmitter and to a measurement method for measuring a torque by recording magnetic field changes. The torque transmitter, the torque sensor and the measurement method are in particular designed to record magnetic field changes caused by the Villari effect, and more particularly to record torques in a magnetoelastic (=opposite of magnetorestrictive) manner.

Such torque sensors that record torques in shafts caused by magnetic field changes, and the scientific principles thereof, are described in the following reference works:

| D1 | Gerhard Hinz and Heinz Voigt "Magnetoelastic Sensors" in "Sensors", VCH Verlagsgesellschaft mbH, 1989, pages 97-152 |
| --- | --- |
| D2 | U.S. Pat. No. 3,311,818 |
| D3 | EP 0 384 042 A2 |
| D4 | DE 30 31 997 A |
| D5 | U.S. Pat. No. 3,011,340 A |
| D6 | U.S. Pat. No. 4,135,391 A |

A structure of torque transmitters as described in D4 (DE 30 31 997 A1) has proven in particular to be particularly effective for measuring torques in shafts and at other measurement points.

One challenge in this technology of measuring torque caused by the magnetoelastic effect and in the arrangement of sensor heads or transmitters is that of achieving distance compensation and/or compensation of what is known as the "RSN". RSN stands for "rotational signal non-uniformity" and denotes a signal variation that occurs when a measurement body moves or rotates, caused by various physical effects at the measurement point. The abovementioned literature has already made efforts to reduce the RSN; a few percent always however typically remain.

The invention set itself the object of providing a torque transmitter, a torque sensor provided therewith and a measurement method by way of which a significant reduction of dependence on distance and reduction of dependence on the RSN is made possible, with simple manufacturability and an inexpensive implementation.

SUMMARY

To achieve this object, the invention provides a torque transmitter as claimed in claim 1. A torque sensor provided therewith and a torque measurement arrangement provided therewith, a manufacturing method therefor and a measurement method using this are the subject matter of the other independent claims.

Advantageous configurations are the subject matter of the dependent claims.

According to one aspect thereof, the invention provides a torque transmitter for a torque sensor for measuring a torque on a shaft, having a carrier plate that has a plurality of sensor element carrier plate regions, on each of which at least one sensor element for recording magnetic field changes, in particular caused by the magnetoelastic effect, is arranged, and at least one enclosure region that is designed to at least partly enclose the shaft around the circumference of the shaft, wherein at least one flexible connection region is provided by way of which at least one of the sensor element carrier plate regions is able to be pivoted relative to another sensor element carrier plate region or relative to the at least one enclosure region.

It is preferable for the enclosure region to be formed at least partly by a plurality of the sensor element carrier plate regions, wherein at least one flexible connection region is arranged between adjacent sensor element carrier plate regions.

It is preferable for the enclosure region to have an annular design, wherein a plurality of sensor element carrier plate regions are arranged radially within the enclosure region spaced apart in the circumferential direction, protrude inwardly and are able to be bent outward in the axial direction by way of the flexible connection region.

It is preferable for each of the sensor elements to have at least one magnetic field generation apparatus for generating a magnetic field in the shaft and one magnetic field recording apparatus for recording a change of the magnetic field caused by a torque acting on the shaft.

It is preferable for the magnetic field generation apparatus to have at least one generator coil and the magnetic field recording apparatus to have at least one measurement coil, wherein at least one, a plurality of or all of these coils are formed as planar coils on the carrier plate.

It is preferable for the carrier plate to be formed by at least one substrate on which the sensor elements are formed, or by at least one circuit board.

According to a further aspect, the invention provides a torque sensor that comprises a sleeve having a through-aperture for passing through a shaft and a torque transmitter that is arranged in or on the sleeve around the through-aperture.

The torque transmitter is in particular designed in accordance with one of the embodiments explained above.

According to a further aspect, the invention provides a torque measurement arrangement for measuring the torque on a shaft, comprising the shaft and a torque transmitter according to one of the configurations described above, which
a) at least partly,
b) mostly or
c) completely
surrounds the shaft.

According to a further aspect, the invention provides a method for manufacturing a torque transmitter, comprising:
a) providing a carrier plate b) populating a plurality of regions of the carrier plate with sensor elements for recording magnetic field changes caused by forces on a shaft,
c) providing at least one flexible connection region between the regions that are populated or to be populated with sensor elements such that at least one enclosure region of the carrier plate is at least partly able to enclose a shaft, with the flexible connection region bending.

It is preferable for step b) to comprise: manufacturing planar coils on the plurality of regions.

A method for manufacturing a torque sensor according to a further aspect of the invention comprises performing the manufacturing method for the torque transmitter according to one of the configurations explained above and embedding the torque transmitter in a sleeve having a through-aperture for attachment to a shaft to be measured.

According to a further aspect, the invention relates to a measurement method for measuring a torque on a shaft, comprising:

Arranging a torque transmitter according to one of the configurations explained above at least partly around the shaft and recording the torque by way of the plurality of sensor elements on regions of the shaft that are spaced apart or distributed in the circumferential direction.

The invention and the advantageous configurations thereof provide a possibility for a measurement that represents a considerably improved independence from distance and a considerably improved independence from the RSN. In the invention, the magnetic field is preferably not coupled locally into a measurement point, but rather the sensor or its torque transmitter is arranged around the shaft. Numerous arrangements come into consideration for this purpose, these being the subject of particularly preferred configurations.

To this end, a plurality of sensor elements that are each able to record torques on a shaft by recording magnetic field changes in a magnetoelastic manner are preferably provided. The torque transmitter is thus particularly suitable for shafts on which a magnetoelastic effect (=opposite of magnetorestrictive=Villari effect) may occur. Eddy current effects or local interfering fields may also influence the RSU/RSN, but also boost the signal level.

Sensor elements that are provided on various carrier plate regions of the torque sensor or its torque transmitter are preferably equipped with planar coils that are designed to generate and/or measure magnetic fields on the shaft.

The sensor element carrier plate regions are preferably designed as sensor cells.

The respective sensor element preferably has at least one ferrite core to close the magnetic circuit. Magnetic field circuits to be measured, which run at least partly through the shaft, in particular on the surface thereof, are in particular able to be formed by a flux concentrator, such as for example ferrite. At least two magnetic field circuits having different directions from one another are preferably measured.

In preferred configurations, between 3 and 10 sensor element carrier plate regions are provided, which are more preferably connected to one another by way of flexible connection regions.

Particularly preferably, each sensor element has at least one generator coil, which is more preferably arranged centrally.

Particularly preferably, each sensor element has at least two measurement coils that are preferably connected to the generator coil by a ferrite core.

A ferrite connection is preferably arranged between a first measurement coil and a generator coil at an angle of between 10° and 170° to a ferrite connection between a second measurement coil and the generator coil.

Two pairs of measurement coils are preferably provided. The measurement coils are preferably arranged in a cross shape around a generator coil.

A planar coil design having four sensor cells, including ferrite, is particularly preferable for closing the magnetic circuit.

In one relatively simple configuration, a first and a second measurement coil per sensor cell are sufficient for a reduced structural size. The signal yield is however higher with five coils.

The generator coils of the individual sensor clusters or sensor elements may be connected together in one preferred configuration. In another particularly preferred configuration, the generator coils of individual sensor elements are operated separately.

During manufacture, it is easily possible to create different power classes of the torque transmitter by virtue of the fact that the number of windings split over the individual coils is selected and manufactured depending on the desired power class.

Magnetic fields of the individual elements flow within one another by virtue of an alternating connection of the coils. When connected in the same way, they cancel each other out. The choice of the connection has a relatively large influence on the suppression of the RSN. Corresponding coils of adjacent sensor elements are particularly preferably connected in the same way.

For a torque transmitter according to one of the configurations described in more detail above, it is thus preferable
6.1 for generator coils (26) of the magnetic field generation apparatuses (20) of at least two adjacent sensor elements (18) to be connected
   6.1.1 alternately or
   6.1.2 in the same way
and/or
6.2 for a plurality of measurement coils (28) of the magnetic field recording apparatus (22) of a sensor element (18) to be connected
   6.2.1 alternately or
   6.2.2 in the same way
and/or
6.3 for mutually corresponding measurement coils (28) of the magnetic field recording apparatuses (22) of at least two adjacent sensor elements (18) to be connected
   6.3.1 alternately or
   6.3.2 in the same way.

The concept of the specific coil connection should be considered independently of the method for manufacturing the torque transmitter and is regarded as an independent concept. Accordingly, what is also disclosed here is a torque transmitter that does not contain the features of the independent claims but rather is as defined in clause 1:

Clause 1:

A torque transmitter (10) for a torque sensor (12) for measuring a torque on a shaft (14), having a plurality of sensor elements (18) for recording magnetic field changes and that are designed such that they are able to be arranged around the shaft, wherein each of the sensor elements (18) has at least one magnetic field generation apparatus (20) for generating a magnetic field in the shaft (14) and one magnetic field recording apparatus (22) for recording a change of the magnetic field caused by a torque applied to the shaft (14), wherein the magnetic field generation apparatus (20)

has at least one generator coil (26) and the magnetic field recording apparatus (22) has a plurality of measurement coils (28), 1 wherein generator coils (26) of the magnetic field generation apparatuses (20) of at least two adjacent sensor elements (18) are connected
   1.1 alternately or
   1.2 in the same way
and/or
2 wherein a plurality of measurement coils (28) of the magnetic field recording apparatus (22) of a sensor element (18) are connected
   2.1 alternately or
   2.2 in the same way
and/or
3 wherein mutually corresponding measurement coils (28) of the magnetic field recording apparatuses (22) of at least two adjacent sensor elements (18) are connected
   3.1 alternately or
   3.2 in the same way.

Preferred configurations of this further concept are given by any desired combination of clause 1 with the features of one of claims 1 to 15.

In the case of an arrangement having a first measurement coil A1, a second measurement coil B1 and a generator coil, the measured signal is preferably formed from a difference between the signal of the first measurement coil A1 and the second measurement coil B1 (A1−B1)=torque. In the case of an arrangement having a first pair of measurement coils A1, A2 and a second pair of measurement coils B1, B2, the pairs preferably lying opposite one another, a measured signal is preferably generated by (A1+A2)−(B1+B2)=torque. As an alternative or in addition, the individual amplitudes A1+A2 and/or B1+B2 are measured directly. The possibilities of forming a measured signal from individual sum signals (amplitudes) and/or from a difference between them help to generate a significantly better and higher signal.

In one preferred configuration, planar coils are clipped onto a plastic sleeve as a holder and in order to keep the planar coils in a correct shape for a casting or injection molding process. In one particularly preferred configuration, this plastic part is then either inserted into an injection molding tool or, in another preferred configuration, is embedded and cast in a second injection mold for casting.

This preferably gives an arrangement of a complete assembly having sensor elements that are connected to one another both mechanically and electrically by way of a flexible connection and that are arranged around the measurement shaft.

In one design of an enclosed shaft for very small shaft diameters, a round carrier plate may for example be provided such that the enclosure region is formed for example as a round circuit board (PCB). Preferably triangular sensor element carrier plate regions containing the sensor elements may be arranged toward the middle, these bending toward the axial direction when a shaft is inserted and thus bearing on the shaft.

In the case of particularly small shafts, it is possible to apply a measurement principle with a generator coil and measurement coils only with relative difficulty, since a ferrite core or as the case may be flux concentrator has manufacturing-based limits in terms of dimensions. An individual yoke made from ferrite or other magnetic booster material may be provided here for example in connection with a magnet.

The planar coils may accordingly for example be formed on latching pins within an annular enclosure region.

A circuit board or PCB, for example in the form of rigid-flex, preferably serves as carrier plate. The connection regions may reach from the circuit board, for example by removing material, giving a thinner bending region.

Another alternative is that of using a circuit board in a semi-flex design.

What is accordingly particularly preferable is a configuration of the method according to the invention for manufacturing a torque transmitter, having one of the following steps:

12.1 singulating the regions of the carrier plate (34) that are populated or to be populated with sensor elements (18), wherein step c) comprises connecting the singulated regions by way of the flexible connection regions (40), or
12.2 providing the carrier plate (34) such that the regions that are populated or to be populated with sensor elements (18) are connected flexibly to one another, or
12.3 providing a flexible carrier plate (34), or
12.3 providing the flexible connection regions through material machining on the carrier plate.

Using planar coils instead of wound coils entails significant advantages with regard to inexpensive and compact production. For example, the planar calls may be manufactured two-dimensionally and then processed three-dimensionally using corresponding production techniques. For more details in this regard, express reference is made to German patent application DE 10 2016 122 172.4, not yet in published form, which explains details with regard to the manufacture of the planar coils, the ferrite cores and the casting procedures.

In one preferred configuration, the torque is measured by measuring a change of the field direction through flux gate measurement. This technology is particularly suitable for very small shafts. In another preferred configuration, the torque is measured by measuring changes of the preferred magnetic direction of the fields and eddy currents caused by surface voltages. For this purpose, a structure as known in principle from document D4 is used, but preferably using circuit board technology and planar coils.

Both technologies may be used in principle to perform a homogeneous measurement around the shaft.

In the technology of measuring the change of the preferred magnetic direction of the fields and eddy currents caused by surface voltages, a 5-coil arrangement—preferably in a cross arrangement having a central generator coil—or a 3-coil technology having a generator coil and two sensor coils, preferably comes respectively at an angle of 45° (+/−10°) from the central axis. It is advantageous for no tilting or rotation to have to be taken into account due to the arrangement of the various sensor elements around the shaft.

By virtue of complete winding around the shaft, there are possibilities of eliminating for example residual magnetic fields by way of a degaussing sequence or reversing possible magnetic hysteresis faults.

A plurality of sensor elements—also called sensor clusters or sensor cells—may be used, these preferably each having at least one generator coil, at least one or preferably two sensor coils and ferrite for flux boosting purposes, and being arranged around the shaft. The arrangement around the shaft is preferably such that the measured field thus generated encompasses the entire measurement shaft. If there are regions that are not recorded in a measurement cycle, the signal noise is increased due to the RSN. To this extent, at least four sensor elements are preferred, and there may also be multiple sensor elements.

The complete circuit board may be produced with a semi-flex or rigid-flex design. A flex design—completely flexible circuit board—is also theoretically possible. Such a design is however relatively expensive and costly in terms of manufacture, and therefore possibly only beneficial for specific applications.

The complete assembly including sensor elements and evaluation electronics may be populated and tested on a blank.

Coils and electronics may preferably be manufactured using 2D technologies and used as a 3D arrangement.

In the measurement method, it is preferable for sensor elements (18) that have at least two pairs of measurement coils (A1, A2; B1, B2) to be used, wherein each pair of measurement coils each measures a magnetic field circuit and the magnetic field circuit of the first pair (A1, A2) is arranged at an angle of 5° to 175°, preferably 20° to 160°, to the magnetic field circuit of the second pair (B1, B2), wherein a measured signal is formed from one or more of the signals of the group of signals that the sum (A) of the signals from the first pair of measurement coils (A1+A2), the sum (B) of the signals from the second pair of measurement coils (B1+B2) and the difference (A−B=(A1+B1)−(B1+B2)) between the sum of the measured signals of the first pair of measurement coils (A1+A2) and the sum of the measured signals of the second pair of measurement coils (B1+B2).

BRIEF DESCRIPTION OF THE DRAWINGS

Exemplary embodiments of the invention are explained in more detail below with reference to the attached drawings. In the figures.

DETAILED DESCRIPTION

Figure 1:
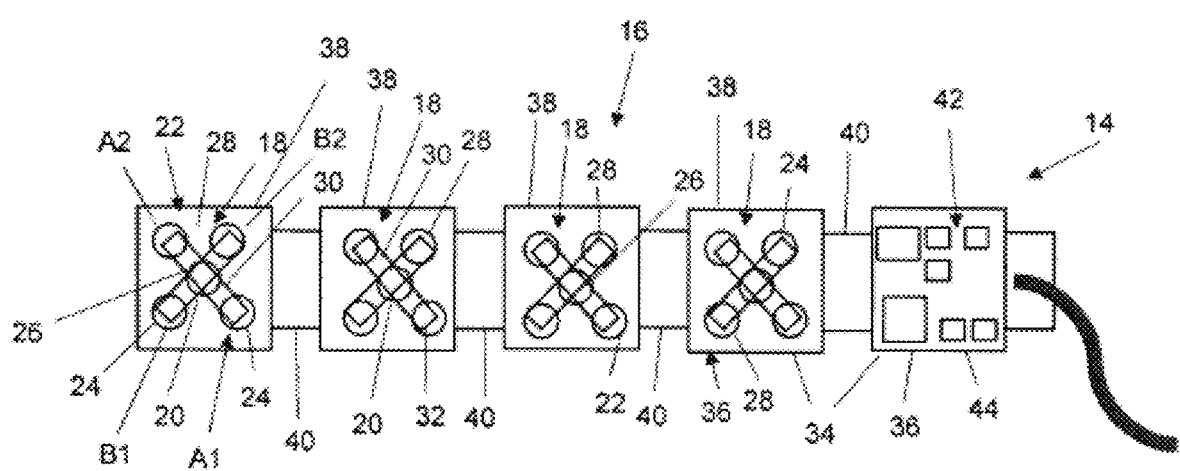
FIG. 1 shows a first exemplary embodiment of a torque transmitter for forming a torque sensor, by way of which torque on a shaft is able to be recorded by recording magnetic field changes caused by the magnetoelastic effect.

The figures illustrate various embodiments of torque transmitters 10 that are able to be used in a torque sensor 12. The torque transmitters 10 are used to measure a torque on a shaft 14. For this purpose, the torque transmitter 10 is designed such that it is able to be arranged around the shaft 14. The arrangement is such that the torque transmitter 10 at least partly, preferably mostly, and more preferably completely, encloses the shaft 14.

For this purpose, the torque transmitter 10 has an enclosure region 16. The torque transmitter 10 furthermore has a plurality of sensor elements that each have a magnetic field generation apparatus 20 and a magnetic field recording apparatus 22.

The magnetic field generation apparatus 20 serves to generate a magnetic field in and in particular on the surface of the shaft 14. The magnetic field recording apparatus 22 is designed to record changes of the magnetic field caused by a torque acting on the shaft 14 caused by the magnetoelastic effect. For more details on possible designs and geometries and on the physical principles, reference is made to documents D1 to D4 mentioned at the outset.

At least one of the apparatuses 20, 22 has at least one coil that is formed as a planar coil 24.

In particularly preferred configurations, the magnetic field generation apparatus 20 has at least one generator coil 26.

In particularly preferred configurations, the magnetic field recording apparatus 22 has at least one measurement coil 28. An arrangement of measurement coils 28 that has a first measurement coil A1 and a second measurement coil B1 is preferably provided.

In particularly preferred configurations, a pair of first measurement coils A1, A2 and a pair of second measurement coils B1, B2 is provided. Both the generator coil 26 and each of the measurement coils 28 are preferably formed as planar coils.

Each of the coils 26, 28 furthermore encloses a magnetic flux concentrator 32 preferably having a ferrite core 30.

All of the sensor elements 18 are preferably manufactured on a—preferably multipart—carrier plate 34. The carrier plate may have a substrate to which the planar coils 24 and the ferrite core 30 have been applied using semiconductor technology methods.

Particularly preferably, the carrier plate 34 has at least one circuit board 36 (PCB), wherein the planar coils 24 are formed on one or more conductor layers of the circuit board 36 and wherein the ferrite core 30 of the individual magnetic flux concentrators 32 is provided in addition, as has been disclosed and explained in detail in DE 10 2016 122 172.4.

The carrier plate 34 may be constructed from a plurality of individual elements. Manufacturing on a carrier plate may also take place, wherein the carrier plate 34 is then divided into a plurality of individual regions through material machining.

A plurality of sensor element carrier plate regions 38 are in particular formed, wherein a sensor element 18 having the corresponding coils 24, 26, 28 and the corresponding magnetic flux concentrator 32 is arranged on each of these sensor element carrier plate regions 38.

A flexible connection region 40 is furthermore provided, by way of which individual regions of the carrier plate 34 are connected to one another in a manner able to be pivoted or bent relative to one another in terms of position, wherein a wired electrical connection is provided at the same time in order to connect the coils 24, 26, 28 to driver and evaluation electronics 42. The components of the driver and evaluation electronics 42 may also be formed on a corresponding region of the carrier plate 34 (electronics carrier plate region 44).

Figure 2:
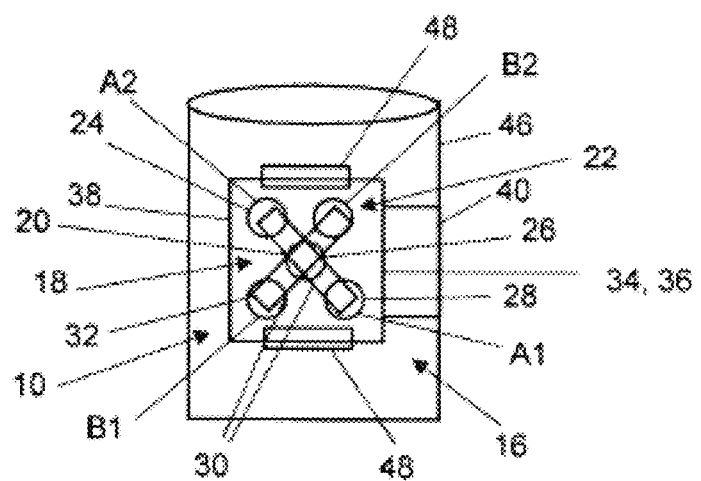
FIG. 2 shows an intermediate step for manufacturing a torque sensor from the torque transmitter from FIG. 1.
Figure 3:
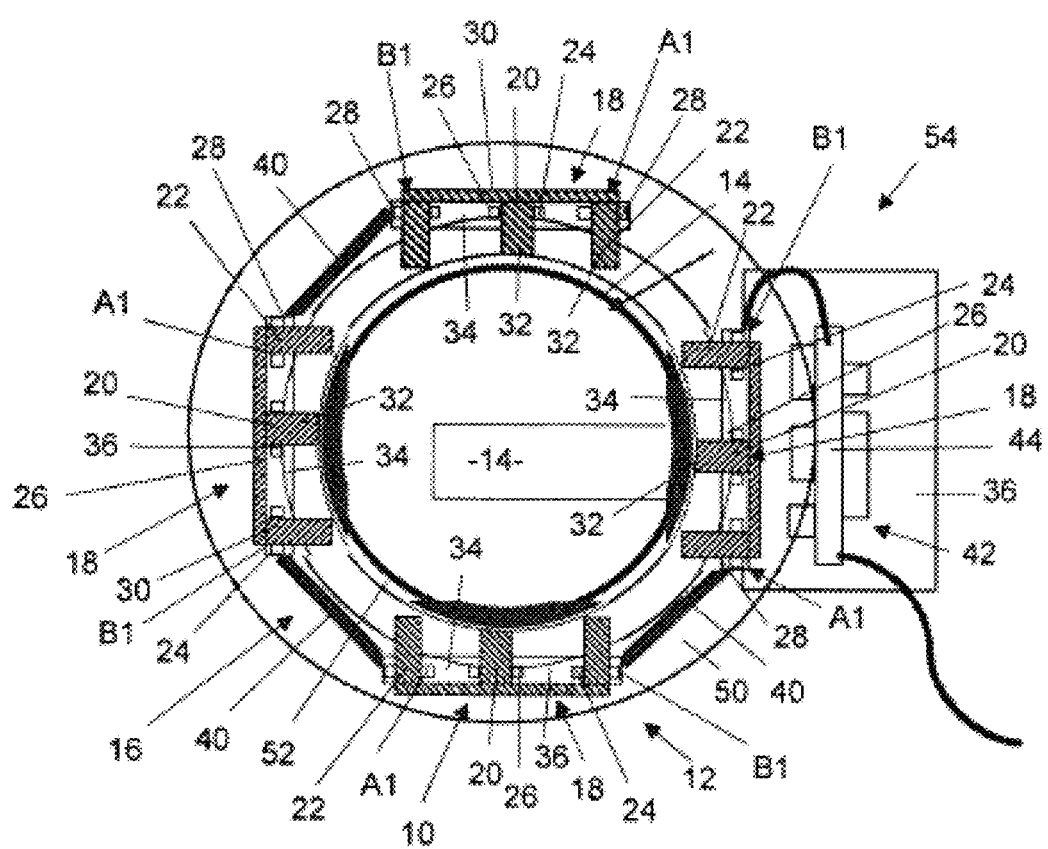
FIG. 3 shows a torque measurement arrangement having a torque sensor that is formed with the torque transmitter from FIG. 1, and a shaft to be measured.

FIGS. 1 to 3 illustrate a first embodiment of the torque transmitter 10, in which a plurality of sensor element carrier plate regions 38 are connected to one another with a flexible connection region 40 between them. In the illustrated embodiment, four sensor element carrier plate regions and therefore four sensor elements 18 are provided. In other configurations, three or five or even more sensor element carrier plate regions 38 having a corresponding number of sensor elements 18 are provided.

The sensor element carrier plate regions 38 may be pivoted toward one another by way of the flexible connection region 40 and thus be placed around the shaft 14.

In one preferred configuration for manufacturing such a torque transmitter 10 according to the first embodiment, the sensor elements 18 are manufactured on the carrier plate 34 and then the flexible connection regions 40 are manufactured by way of material removal such that conductor tracks for the connection between coils 26, 28 and the driver and evaluation electronics 42 remain but the flexible connection region 40 is able to be bent relative to the sensor element carrier plate regions 38.

One embodiment for manufacturing a torque sensor 12 using the torque transmitter 10 of the first embodiment is explained in more detail below with reference to the illustration in FIGS. 2 and 3. FIG. 2 illustrates a carrier sleeve 46 that may be made for example from plastic and has attachment elements for—for example temporarily—holding the sensor element carrier plate regions 38.

In this configuration of the torque transmitter, the enclosure region 16 is formed by the individual sensor element carrier plate regions 38 with the flexible connection regions 40 between them. This is guided around the carrier sleeve 46, wherein the sensor element carrier plate regions 38 are fixed to the carrier sleeve 46 by way of the attachment elements—for example retaining clips 48.

This structure of FIG. 2 may then be inserted into an injection molding machine and be injection-molded with plastic around the outside in order thereby to produce a sleeve 50 in which the torque transmitter 10 is arranged around a through-aperture 52 of the sleeve. The individual elements of the torque transmitter 10 are thus embedded and packed in plastic. It is possible to pass the shaft 14 to be measured through the interior of the through-aperture 52, giving the torque measurement arrangement 54 shown in FIG. 3.

In one configuration, the carrier sleeve 46 remains present as further protection; in another configuration, the carrier sleeve 46 is removed following the injection-molding with the sleeve 50.

FIG. 3 shows the torque measurement arrangement 54 having the shaft 14 and the torque sensor 12 formed by the sleeve 50 and the torque transmitter 10.

In this case, the sensor elements 18 preferably each lie diametrically opposite one another in pairs.

By arranging individual sensor elements around the shaft 14 to be measured, it is possible to compensate dependencies of the torque measured signal on distance changes and variations in the sensor signal caused by other effects during rotation of the shaft (RSN), giving a measured signal that is as independent as possible from tolerances in the mounting of the shaft and its circumference and as independent as possible from material inconsistencies around the circumference of the shaft.

The connection of the individual coils of the sensor elements 18 may in this case be selected in various ways. In one configuration, manufacturing takes place such that the generator coils 26 are selectively connected in the same way as or alternately to one another, in series or in parallel, to an AC current source (not illustrated, for example implemented in the electronics on the electronics carrier plate region 44). In an alternative connection, the generator coils 26 are able to be driven individually or differently connected in groups.

The connection of the measurement coils 28 of the sensor elements 18 may also be different. A connection is preferably made such that both the sum of the signals of the first pairs A1+A2, sensitive in a first direction, of the measurement coils and the sum of the signals of the second pair (B1+B2), sensitive in a second direction, are able to be measured directly and the difference between these sums is able to be measured.

Figure 4:
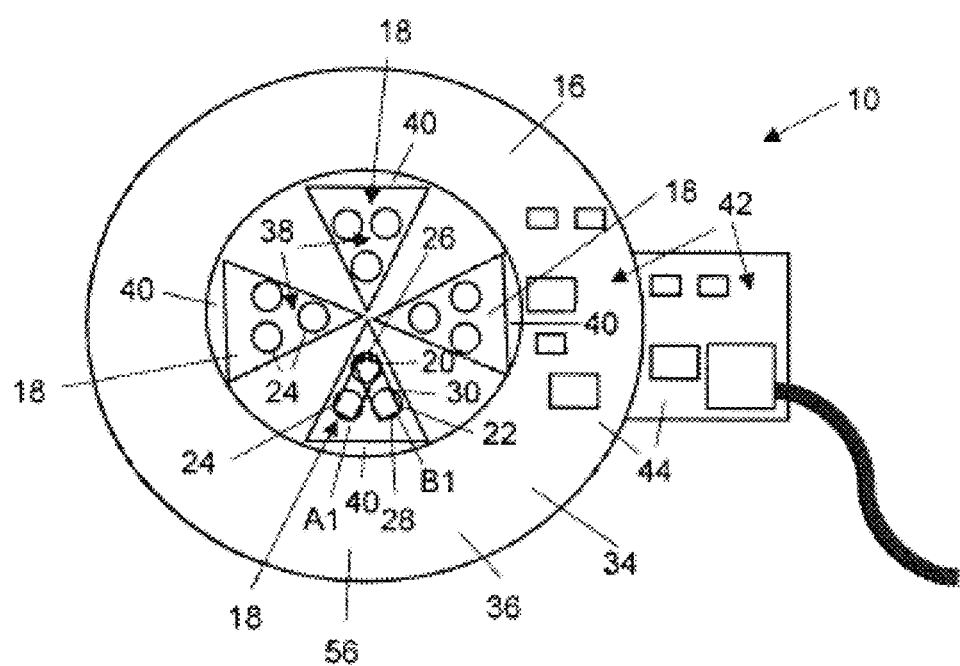
FIG. 4 shows a further exemplary embodiment of a torque transmitter.

FIG. 4 illustrates a further exemplary embodiment of the torque transmitter 10 that is suitable for smaller shaft diameters.

The enclosure region 16 here is not formed by sensor element carrier plate regions 38 that are connected to one another, but rather by a dedicated annular region 56 of the carrier plate 34, wherein sensor element carrier plate regions 38 are braced inwardly at an inner region. A flexible connection region 40 is provided in each case between the sensor element carrier plate regions 38 and the annular region 56, such that the sensor element carrier plate regions 38 are able to be folded out axially from the plane of the drawing in FIG. 4. Intended breaking points may for example be provided for this purpose between the individual sensor element carrier plate regions 38.

Figure 6:
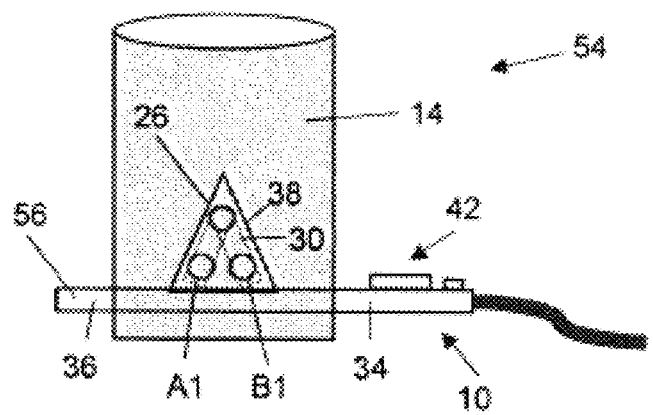
FIG. 6 shows a torque measurement arrangement for measuring a torque on a shaft, comprising the shaft and a torque transmitter according to the embodiment from FIG. 4 arranged around the shaft.

As illustrated in FIG. 6, the shaft 14 is able to be passed through the interior of the annular region 56, such that the sensor element carrier plate regions 38 on the flexible connection regions 40 pivot away in an axial direction and bear on the shaft 14 distributed around the circumference of the shaft 14.

In the illustration from FIG. 4, a generator coil 26 and a first measurement coil A1 and a second measurement coil B1 are provided, such that three planar coils 24 are provided per sensor element 18, wherein the ferrite cores 30, which are provided between the generator coil 26 and each of the measurement coils A1, B1, enclose an angle between them of between 90° and 0°, and in particular between 55° and 35°.

Figure 5:
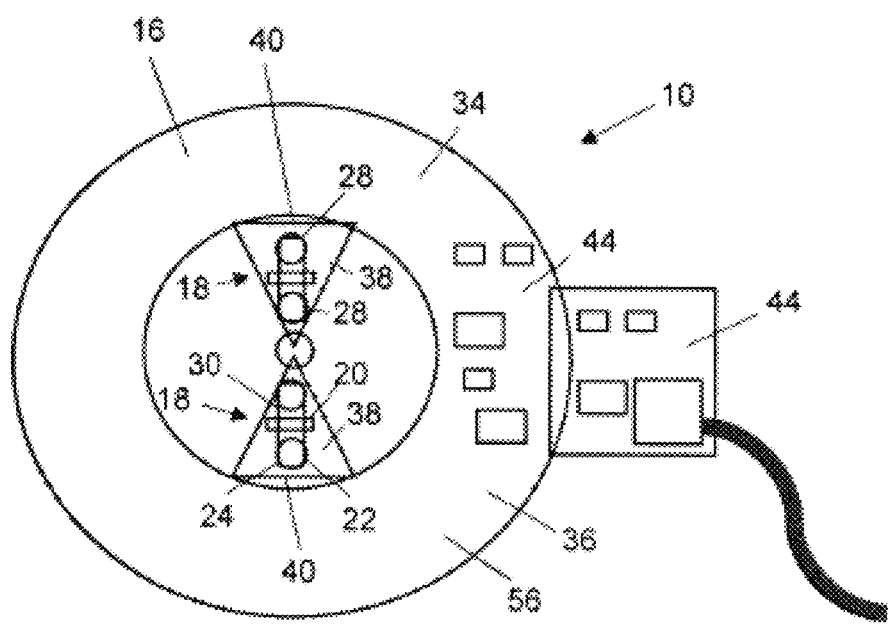
FIG. 5 shows yet another embodiment of a torque transmitter.

FIG. 5 illustrates yet another embodiment for very small shaft diameters. This configuration corresponds in terms of basic structure to the configuration from FIG. 4, with an annular region 56 and inwardly protruding sensor element carrier plate regions 38. In this case, only two sensor elements 18 are provided, wherein the magnetic field generation apparatus 20 has a permanent magnet and direction changes of magnetic field lines are recorded by way of the magnetic field recording apparatus 22.

Figure 7:
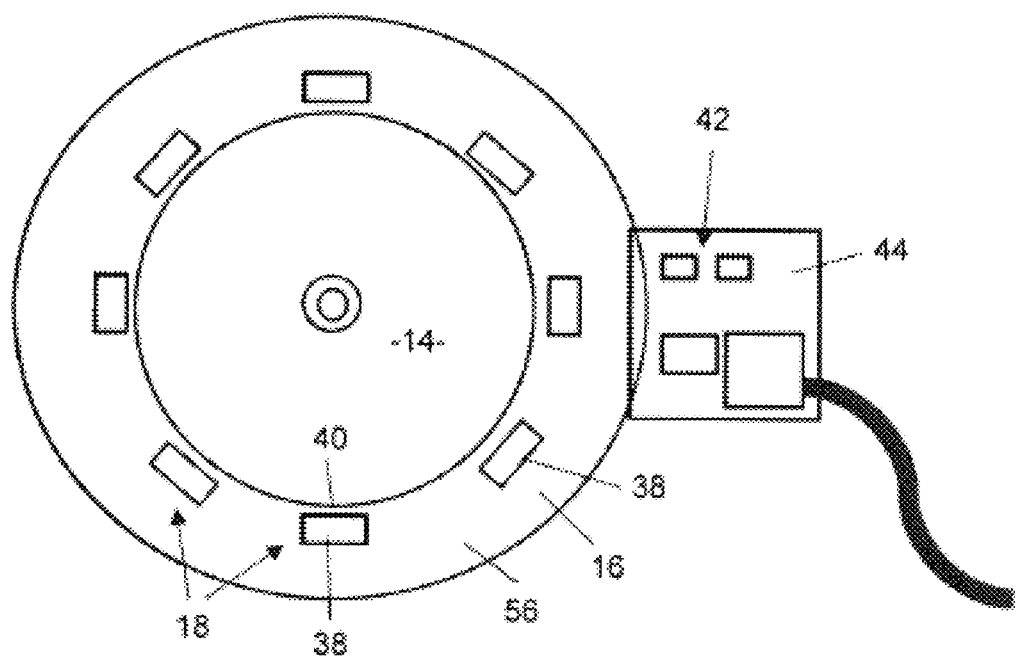
FIG. 7 shows a plan view of a comparable torque measurement arrangement that applies another embodiment of a torque transmitter.

FIG. 7 shows the arrangement of the annular region 56 of a further configuration of the torque transmitter 10 that corresponds in terms of basic structure to the structure of FIGS. 4 and 5, wherein an even greater number of sensor elements 18 is further provided around the shaft 14.

LIST OF REFERENCE SIGNS

10 Torque transmitter
12 Torque sensor
14 Shaft
16 Enclosure region
18 Sensor element
20 Magnetic field generation apparatus
22 Magnetic field recording apparatus
24 Planar coil
26 Generator coil
28 Measurement coil
A1 First measurement coil
B1 Second measurement coil
A2 First measurement coil
B2 Second measurement coil
30 Ferrite core
32 Magnetic flux concentrator
34 Carrier plate
36 Circuit board 38 Sensor element carrier plate region
40 Flexible connection region
42 Driver and evaluation electronics
44 Electronics carrier plate region
46 Carrier sleeve
48 Retaining clips
50 Sleeve
52 Through-aperture
54 Torque measurement arrangement
56 Annular region

What is claimed is:

1. A torque transmitter for a torque sensor for measuring a torque on a shaft, comprising:
a carrier plate that includes a plurality of sensor element carrier plate regions, on each of which at least one sensor element for recording magnetic field changes is arranged; and
an enclosure region formed in a substantially annular shape to enclose the shaft around a circumference of the shaft,
wherein the plurality of sensor element carrier plate regions are perpendicularly connected to the enclosure region and arranged radially within the enclosure region by being spaced apart along a circumferential direction around the circumference of the shaft.

2. The torque transmitter of claim 1, wherein each of the at least one sensor element comprises:
at least one magnetic field generation apparatus for generating a magnetic field in the shaft; and
at least one magnetic field recording apparatus for recording a change of the magnetic field caused by the torque acting on the shaft.

3. The torque transmitter of claim 2, wherein the magnetic field generation apparatus includes at least one generator coil, and the magnetic field recording apparatus includes at least one measurement coil, and
wherein at least one of the coils is formed as a planar coil on the carrier plate.

4. The torque transmitter of claim 3, wherein the generator coils of the magnetic field generation apparatuses of at least two adjacent sensor elements are connected alternately or in parallel.

5. The torque transmitter of claim 3, wherein a plurality of measurement coils are provided in the magnetic field recording apparatus of a sensor element and are connected alternately or in parallel.

6. The torque transmitter of claim 3, wherein mutually corresponding measurement coils of the magnetic field recording apparatuses of at least two adjacent sensor elements are connected alternately or in parallel.

7. The torque transmitter of claim 1, wherein the carrier plate is formed by at least one substrate on which the sensor elements are formed.

8. The torque transmitter of claim 7 wherein each of the plurality of sensors element carrier plate regions is formed as a circuit board.

9. The torque transmitter of claim 1, wherein the enclosure region is formed as a circuit board.

10. A torque measurement system for measuring a torque on a shaft, comprising:
the torque transmitter of claim 1 arranged around the shaft,
wherein the torque is recorded by way of the plurality of sensor elements on regions of the shaft that are distributed in the circumferential direction.

11. The torque measurement system of claim 10, wherein the sensor elements include at least two pairs of measurement coils (A1, A2; B1, B2), and
wherein each pair of measurement coils measures a magnetic field circuit, and the magnetic field circuit of a first pair (A1, A2) is arranged at an angle of 5° to 175° to the magnetic field circuit of a second pair (B1, B2).

12. The torque measurement system of claim 11, wherein a measured signal is formed based on a sum (A) of signals from the first pair of measurement coils (A1+A2).

13. The torque measurement system of claim 11, wherein a measured signal is formed based on a sum (B) of signals from the second pair of measurement coils (B1+B2).

14. The torque measurement system of claim 11, wherein a measured signal is formed based on a difference (A−B= (A1+B1)−(B1+B2)) between a sum of signals from the first pair of measurement coils (A1+A2) and a sum of signals from the second pair of measurement coils (B1+B2).

* * * * *